United States Patent
Norrbakhsh et al.

(10) Patent No.: US 6,353,210 B1
(45) Date of Patent: Mar. 5, 2002

(54) CORRECTION OF WAFER TEMPERATURE DRIFT IN A PLASMA REACTOR BASED UPON CONTINUOUS WAFER TEMPERATURE MEASUREMENTS USING AND IN-SITU WAFER TEMPERATURE OPTICAL PROBE

(75) Inventors: Hamid Norrbakhsh, Fremont; Mike Welch, Livermore; Paul Luscher; Siamak Salimian, both of Sunnyvale; Brad Mays, San Jose, all of CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 09/547,359

(22) Filed: Apr. 11, 2000

(51) Int. Cl.⁷ ............................. H05B 1/00; A21B 2/00; F27B 5/06; G01K 1/00
(52) U.S. Cl. ................... 219/497; 219/390; 219/444.1; 219/121.43; 392/416
(58) Field of Search ........................ 374/12, 141, 130, 374/132, 154, 208, 198, 131, 121, 124, 126, 128, 133; 219/390, 121.43, 444.1, 497; 392/416, 418

(56) References Cited

U.S. PATENT DOCUMENTS

| | | | |
|---|---|---|---|
| 5,442,727 A | * | 8/1995 | Fiory .......................... 392/416 |
| 5,449,883 A | * | 9/1995 | Tsuruta ........................ 219/483 |
| 5,549,756 A | * | 8/1996 | Sorensen et al. ............ 118/715 |
| 5,558,717 A | * | 9/1996 | Zhao et al. .................. 118/715 |
| 6,002,572 A | * | 12/1999 | Hirose et al. ............... 361/213 |
| 6,046,439 A | * | 4/2000 | Johnsgard et al. ........ 219/444.1 |
| 6,064,799 A | * | 5/2000 | Anderson et al. ............ 392/416 |
| 6,072,163 A | * | 6/2000 | Armstrong et al. .......... 219/497 |
| 6,169,274 B1 | * | 1/2001 | Kulp .......................... 219/497 |
| 6,191,394 B1 | * | 2/2001 | Shirakawa et al. ....... 219/444.1 |
| 6,193,414 B1 | * | 2/2001 | Balzano ...................... 374/208 |
| 6,216,475 B1 | * | 4/2001 | Sada et al. ..................... 62/99 |
| 6,232,580 B1 | * | 5/2001 | Sandhu ........................ 219/390 |
| 2001/0006530 A1 | * | 7/2001 | Adams et al. ............... 374/131 |
| 2001/0011653 A1 | * | 8/2001 | Shirakawa et al. .......... 219/390 |
| 2001/0013515 A1 | * | 8/2001 | Harada et al. ............... 219/390 |

* cited by examiner

Primary Examiner—Diego Gutierrez
Assistant Examiner—Gail Verbitsky
(74) Attorney, Agent, or Firm—Michaelson and Wallace (57) ABSTRACT

The invention solves the problem of continuously monitoring wafer temperature during processing using an optical or fluoro-optical temperature sensor including an optical fiber having an end next to and facing the backside of the wafer. This optical fiber is accommodated without disturbing plasma processing by providing in one of the wafer lift pins an axial void through which the optical fiber passes. The end of the fiber facing the wafer backside is coincident with the end of the hollow lift pin. The other end is coupled via an "external" optical fiber to temperature probe electronics external of the reactor chamber. The invention uses direct wafer temperature measurements with a test wafer to establish a data base of wafer temperature behavior as a function of coolant pressure and a data base of wafer temperature behavior as a function of wafer support or "puck" temperature. These data bases are then employed during processing of a production wafer to control coolant pressure in such a manner as to minimize wafer temperature deviation from the desired temperature.

20 Claims, 5 Drawing Sheets

CORRECTION OF WAFER TEMPERATURE DRIFT IN A PLASMA REACTOR BASED UPON CONTINUOUS WAFER TEMPERATURE MEASUREMENTS USING AND IN-SITU WAFER TEMPERATURE OPTICAL PROBE

BACKGROUND OF THE INVENTION

Precise control of plasma processing of semiconductor wafers requires that the wafer temperature be carefully regulated or held very close to a desired temperature. Drift of wafer temperature causes various characteristics of the plasma process to change, so that the process cannot be accurately controlled. For example, in a plasma etch process, the etch rate may increase if the wafer temperature drifts toward a higher temperature. Typically, plasma processing will increase the wafer temperature. In order to maintain the wafer temperature at a desired level, the wafer is cooled during plasma processing by pumping a coolant such as Helium gas through the wafer support through coolant passages which permit the coolant to conduct heat away from the wafer backside. The cooling rate is proportional to the pressure at which the coolant is supplied to the coolant passages in the wafer support, so that the wafer temperature is directly affected by the coolant pressure. Thus, it is conventional to set the coolant pressure to a constant value corresponding to a desired wafer temperature during processing.

Heretofore, it has been assumed that with the foregoing cooling technique, wafer temperature is generally constant during plasma processing of the wafer. This is an important assumption, particularly in the case of nitride processes, because plasma etch processes for etching nitride layers are very sensitive to changes in temperature. Wafer temperature has typically been measured using conventional (commercially available) "temperature dots" which can be stuck to the surface of a test wafer. At the conclusion of plasma processing of the test wafer, the color of the temperature dot indicates the highest temperature reached during the process. Assuming the wafer temperature is constant over the duration of the plasma process, this temperature is generally taken to be the process temperature of the wafer.

However, it has not been practical to test the assumption of constant wafer temperature during the process. For example, at plasma ignition, it is assumed the wafer temperature climbs very quickly (e.g., within a matter of seconds) from room temperature to the steady-state plasma processing temperature. This assumption could not be verified because direct measurement of wafer temperature during processing—and particularly during processing of production wafers—has not been practical. The only temperature that can be continuously monitored during processing is the wafer support or "puck" temperature, which is at a temperature significantly lower than that of the wafer during processing.

As described below, one aspect of the present invention provides a highly accurate probe with which the temperature of a test wafer having a special dye in a predetermined spot can be continuously monitored during plasma processing. With this probe, it has been discovered that the wafer temperature is not constant during processing, because, among other things, the wafer takes a surprisingly long time (over one minute) to climb from room temperature to steady state process temperature following plasma ignition. Such variations in wafer temperature are detrimental because they tend to reduce the precision with which the process parameters (e.g., etch rate) may be controlled. It was also discovered that, in a plasma reactor employing an electrostatic chuck, the wafer temperature climbs very high near the end of plasma processing. This is because coolant pressure is removed before turning off RF power to the electrostatic chuck holding the wafer on the wafer support. Otherwise, the wafer would be blown off the wafer support by the coolant pressure on the wafer backside as soon as RF power is removed from the electrostatic chuck.

Thus, it is a discovery of the invention that there is a need to sense deviations in wafer temperature from a desired temperature and to somehow correct such deviations. While this is certainly possible in the case of a test wafer whose temperature throughout processing is continuously monitored using the probe of the invention referred to above, it does not seem possible in the case of a production wafer which should not be contaminated with the dye required for the probe to measure wafer temperature.

Thus, there is a need for a way of deducing in real time deviations of the temperature of a production wafer from a desired temperature during processing, without being able to directly measure the wafer temperature. Further, there is a need for a way of changing the system in response to such deviations to minimize or avoid them.

SUMMARY OF THE INVENTION

The invention solves the problem of continuously monitoring wafer temperature during processing using an optical or fluoro-optical temperature sensor including an optical fiber having an end next to and facing the backside of the wafer. This optical fiber is accommodated without disturbing plasma processing by providing in one of the wafer lift pins an axial void through which the optical fiber passes. The end of the fiber facing the wafer backside is coincident with the end of the hollow lift pin. The other end is coupled via an "external" optical fiber to temperature probe electronics external of the reactor chamber. In a preferred embodiment, the hollow lift pin is supported with the other lift pins on a lift spider and a flexible bellows assembly. The optical fiber inside the hollow lift pin and the external optical fiber are preferably coupled together by a flexure near the bottom of the bellows. Preferably, a cavity smaller than the diameter of the optical fiber is drilled in the wafer backside in registration with the optical fiber inside the lift pin, and a suitable dye is deposited in the cavity to facilitate temperature sensing by the sensor.

The invention also solves the problem of determining wafer temperature deviations in production wafers in which there is no cavity nor dye in the wafer backside enabling temperature measurement by the optical probe. The invention solves this problem by first, using direct wafer temperature measurements with a test wafer, establishing a data base of wafer temperature behavior as a function of coolant pressure and establishing a data base of wafer temperature behavior as a function of wafer support or "puck" temperature. These data bases are then employed during processing of a production wafer to control coolant pressure in such a manner as to minimize wafer temperature deviation from the desired temperature.

In a preferred embodiment, such control of the coolant pressure is accomplished by first measuring puck temperature and using the data base of wafer temperature as a function of puck temperature to deduce the wafer temperature from the measured puck temperature. Then, the wafer temperature thus deduced is compared with a desired temperature to calculate an error. This error is used with the data base of wafer temperature as a function of coolant pressure to determine a change in the coolant pressure which will tend to correct the error in the manner of a feedback control system.

In another embodiment, the corrections to the coolant pressure are established in a trial-and-error method. Thus, for example, the delay in wafer temperature rise immediately after plasma ignition is corrected by a corresponding delay in applying or increasing the coolant pressure immediately after plasma ignition, the coolant pressure being gradually increased in accordance with a schedule (of coolant pressure as a function of time after plasma ignition) that permits the wafer temperature to increase very quickly to the desired temperature and remain there. The trial-and-error method of establishing the schedule of coolant pressure is carried out with a test wafer using the optical wafer temperature probe of the invention. The coolant schedule is modified over successive attempts until a fairly constant wafer temperature from plasma ignition onward is achieved. Then, the schedule of coolant pressure is applied to production wafers.

In a yet further embodiment, the wafer temperature behavior observed in test wafers with the optical probe of the invention is parameterized in an equation as a function of coolant pressure and puck temperature. This equation is then employed to accurately calculate coolant pressure corrections based upon continuously measured puck temperature.

The problem of wafer temperature increase just prior to wafer de-chuck from the electrostatic chuck (i.e., when the coolant pressure is turned off) is solved by reducing the RF power on the electrostatic chuck to a level at which heat transfer to the wafer is reduced but which is still sufficient to electrostatically retain the wafer on the chuck.

DETAILED DESCRIPTION OF THE PREFERRED EMBODIMENTS

Wafer Temperature Optical Probe

Figure 1:
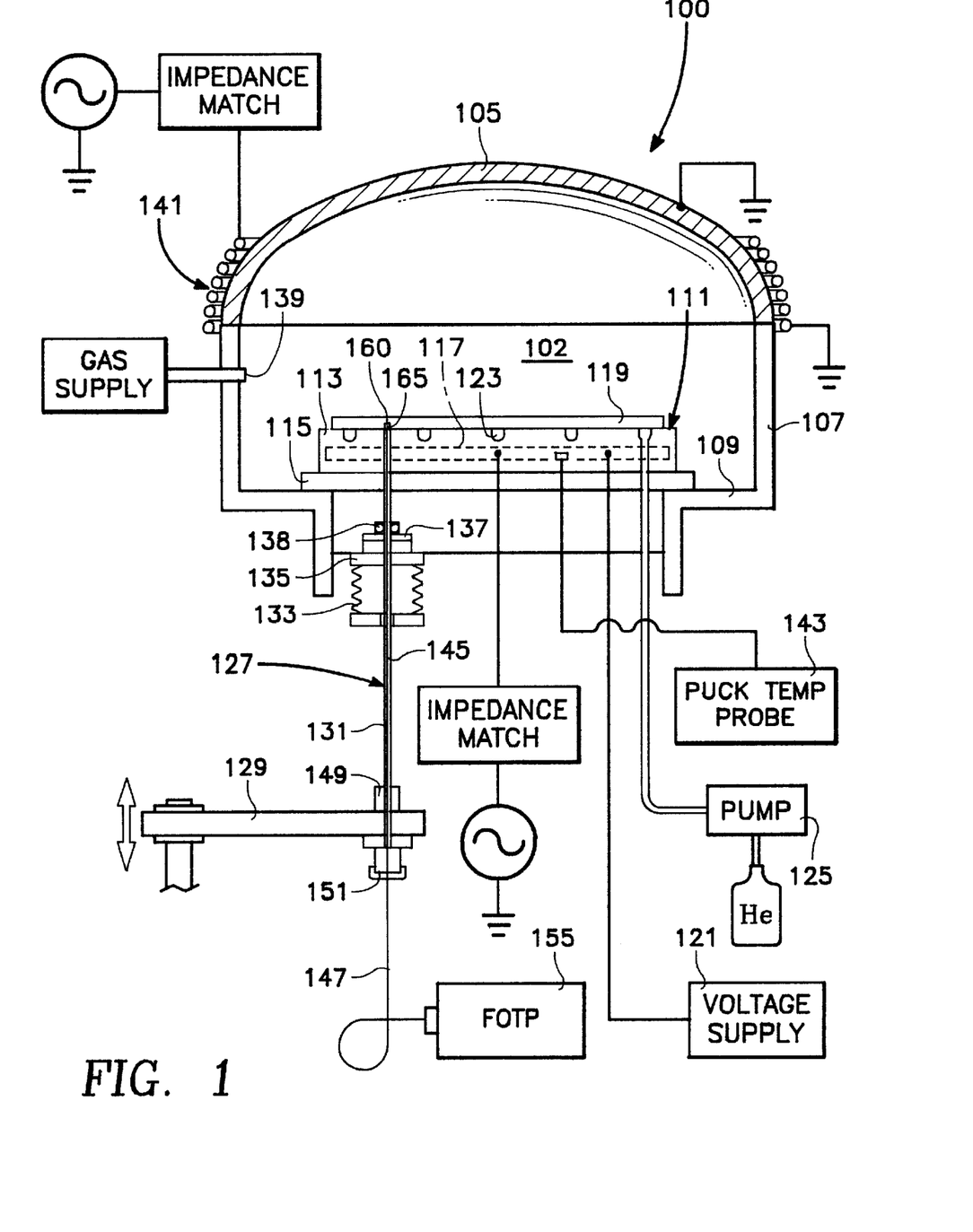
FIG. 1 is a cross-sectional side view of a portion of a plasma reactor including a preferred embodiment of the optical temperature probe of the invention.

Referring to FIG. 1, a plasma reactor 100 has a vacuum chamber enclosure 102 including a ceiling 105 and cylindrical side wall 107 adjoining a floor 109. An electrostatic chuck 111 on the floor 109 includes a ceramic (aluminum nitride) puck 113 on a support 115 and an electrode mesh 117 inside the ceramic puck 113. A semiconductor wafer 119 is held firmly onto the ceramic puck 113 by an electrostatic force induced by a chucking voltage from a chuck voltage source 121 applied to the electrode mesh 117. The ceramic puck 113 has coolant passages 123 in its top surface which permit a coolant circulated therethrough (such as helium gas) to directly contact the backside of the wafer 119. For this purpose, a coolant pump 125 pumps helium gas into the coolant passages 123 at a selected gas pressure. The wafer 119 is lifted off the electrostatic chuck 111 by plural lift pins 127 which extend throughout the electrostatic chuck 111 to contact the backside of the wafer 119. The lift pins 127 are moved up and down by a lift spider 129 through a bellows assembly including a rod 131 underlying each pin 127, a portion of the rod being held within a flexible bellows 133. The rod 131 supports a piston plate 135 and housing 137 to which the lift pin 127 is threadably connected and sealed by an O-ring 138. The wafer 119 is placed on the electrostatic chuck 111 by lowering the lift spider 129 until the wafer backside touches the puck 113. Then, the chucking voltage source 121 is activated to apply a chucking voltage to the electrode mesh 117. Thereafter, the coolant pump 125 pumps coolant into the passages 123 to cool the wafer 119. A plasma is ignited by introducing a processing gas through gas inlets 139 into the reactor chamber and coupling RF power into the chamber. The power may be coupled capacitively by applying it to the electrode mesh 117 and grounding the ceiling 105. Alternatively, the RF power may be coupled inductively by applying RF power to a coil antenna 141 adjacent the wall 107 or ceiling 105, in which case an RF bias voltage may be applied to the electrode mesh 117 to control ion energy near the wafer 119.

In order to obtain an indirect indication of the temperature of the wafer 119, a puck temperature probe 143 provides a continuous read out of the temperature of the puck 113 during plasma processing. Heretofore, it has not been practical to obtain a continuous direct measurement of wafer temperature, notwithstanding the criticality of the wafer temperature during certain plasma processes such as a nitride etch operation, for example.

In order to solve this problem, one of the cylindrical lift pins 127 is made to be hollow, and a light pipe 145 is inserted through the hollow lift pin 127. In addition, the rod 131 is also hollow so that the light pipe 145 extends through the interior of the rod 131 as well. The top end of the light pipe 145 coincides with the top of the lift pin 127 against the wafer backside. The bottom end of the light pipe 145 extends to the lift spider 129 and is coupled to a flexible optical fiber 147. For this purpose, the light pipe is fed through the top of the lift spider 129 by a flexure 149 and is terminated at the bottom of the lift spider 129 at one end of a standard fiber optic connector 151. The flexible optical fiber 147 is connected to the other end of the fiber optic connector 151.

While the light pipe 145 may be a flexible quartz optical fiber, it is preferably a sapphire rod because it has a higher numerical aperture than a quartz fiber. The opposite end of the flexible optical fiber 147 is connected to conventional probe electronics 155, which may be, for example, a Luxtron Fluoro-Optical Temperature (FOT) probe. This type of probe requires a chemical dye be placed on the surface whose temperature is to be measured by the probe. Therefore, a mechanical cavity 160 having a diameter less than that of the lift pin 127 is formed in the backside of the test wafer 119, the mechanical cavity 160 being in registration with the lift pin 127 and light pipe 145. The requisite chemical dye or phosphor 165 is placed in the cavity 160. The presence of the light pipe 145 does not compromise the plasma processing because the light pipe is isolated from the plasma even though it may contact or at least nearly contact the backside of the wafer 119. This is because the open end of hollow lift pin 127 abuts the wafer backside while the wafer backside is electrostatically clamped to the puck 113. Moreover, the lift pin 127 is sealed to the housing 137 by the O-ring 138. Therefore, the wafer temperature optical probe (i.e., the light pipe 145, optical fiber 147 and FOT 155) of the invention provides a continuous measurement of temperature of the wafer 119.

Method for Controlling Wafer Temperature

Figure 2:
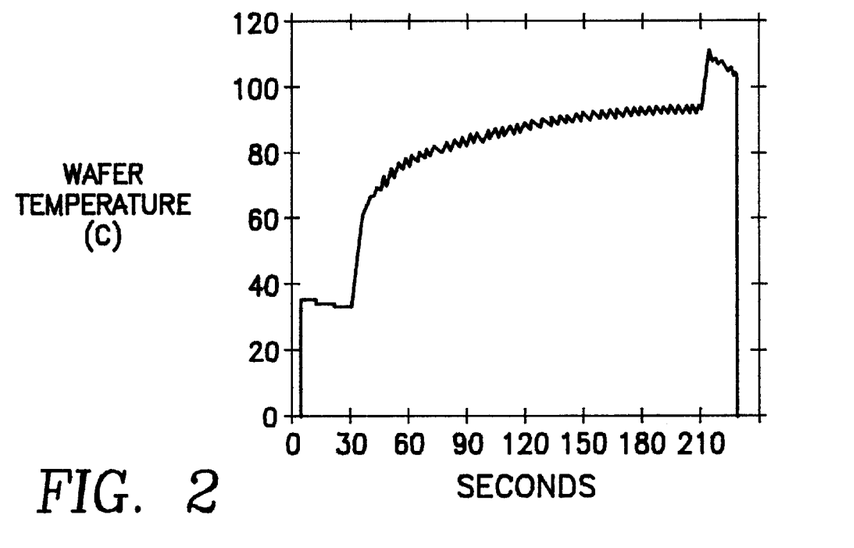
FIG. 2 illustrates the behavior of wafer temperature at plasma ignition using constant coolant pressure on the wafer backside.

The probe of FIG. 1 has enabled for the first time an accurate assessment of wafer temperature behavior throughout the entire plasma process cycle. FIG. 2 is a graph illustrating the wafer temperature measured with the probe of FIG. 1 over time beginning with plasma ignition at 0 seconds and concluding with wafer de-chucking at about 240 seconds. What FIG. 2 indicates is that the assumptions regarding fairly constant wafer temperature behavior were incorrect, in that the wafer temperature does not reach the equilibrium plasma processing temperature around 90 degrees C for nearly two minutes. Thus, for the first two minutes of a plasma process cycle that is only four minutes in duration, the wafer temperature is not in control and is below the desired temperature, in the example of FIG. 2. FIG. 2 also shows that at 210 seconds when the helium coolant pressure is removed in preparation for dechucking the wafer, the wafer temperature soars by about 15 degrees until RF power is turned off at about 235 seconds.

In order to solve the problem of the slow warming up of the wafer during the first 90 seconds after plasma ignition, the invention uses a large data base gathered using the optical temperature probe of FIG. 1 with a test wafer. One difficulty is that a straightforward approach of directly monitoring the temperature of each wafer being processed using the probe of FIG. 1 and altering the coolant pressure in a directly controlled feedback control loop to maintain the desired wafer temperature is not possible except in the special case of a test wafer having the mechanical cavity 160 and phosphor dye placed therein. Unfortunately, a production wafer cannot have such a cavity nor a chemical dye or phosphor placed thereon. Therefore, direct continuous temperature measurement of a production wafer is not possible, even with the probe of FIG. 1. The closest temperature to the wafer 119 that can be continuously monitored during processing of production wafers is that of the puck 113. However, tests conducted using the wafer temperature probe of FIG. 1 and a temperature probe in the puck 113 reveal that the puck temperature is well below the wafer temperature, particularly during the first 120 following plasma ignition. Therefore, the puck temperature cannot be substituted for the wafer temperature in a control loop, particularly during the early part of the plasma process cycle following plasma ignition.

The foregoing problems are solved in the invention by first employing a test wafer with the probe of FIG. 1 and a puck temperature probe and correlating the temperature behavior of the wafer the temperature behavior of the puck. Furthermore, the test wafer is employed with the probe of FIG. 1 to correlate wafer temperature with the coolant pressure. Then, whenever a production wafer is processed, the puck temperature is monitored, and the actual wafer temperature is inferred from the measured puck temperature using the correlation of wafer and puck temperatures obtained with the test wafer. If the inferred temperature of the production wafer deviates from a desired wafer temperature, a correction to the coolant pressure is inferred from the observed deviation using the correlation of wafer temperature and coolant pressure obtained with the test wafer. The result is that the slow increase in wafer temperature is automatically corrected by a series of coolant temperature corrections, in which the coolant pressure is suppressed near the beginning of the plasma process and is increased during the process to maintain the desired wafer temperature.

Alternatively, the optimum coolant pressure profile over time may be found by trial and error using a test wafer and the probe of FIG. 1. The coolant pressure is controlled in accordance with this optimum profile during the processing of production wafers.

Figure 3:
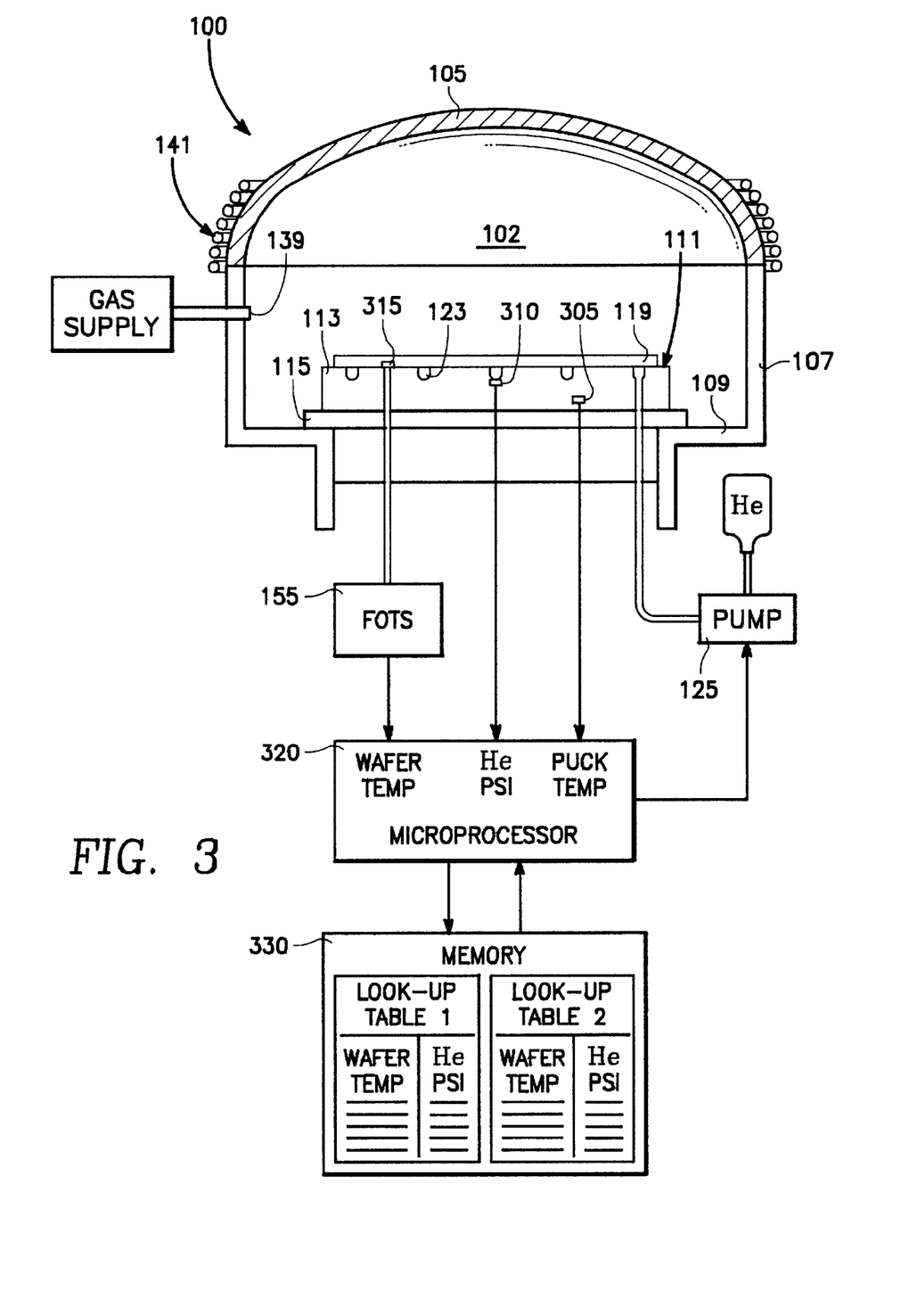
FIG. 3 illustrates a system, including a plasma reactor having the optical temperature probe of FIG. 2, for characterizing wafer temperature behavior and for controlling coolant pressure to minimize wafer temperature drift.

FIG. 3 illustrates a system for carrying out the foregoing temperature control methods. The plasma reactor of FIG. 1 is illustrated in FIG. 3 as including, in addition to the features discussed above with reference to FIG. 1, a puck temperature probe 305, a gas pressure probe 310 and the wafer temperature probe of FIG. 1 designated by the reference numeral 315 in FIG. 3. The puck temperature probe 305 consists of a conventional temperature sensor inside the puck 113. The helium pressure probe 310 consists of a conventional pressure sensor inside one of the coolant passages 123. Each of the three probes 305, 310, 315 has its output connected to a microprocessor 320 which uses a memory 330.

Figure 4:
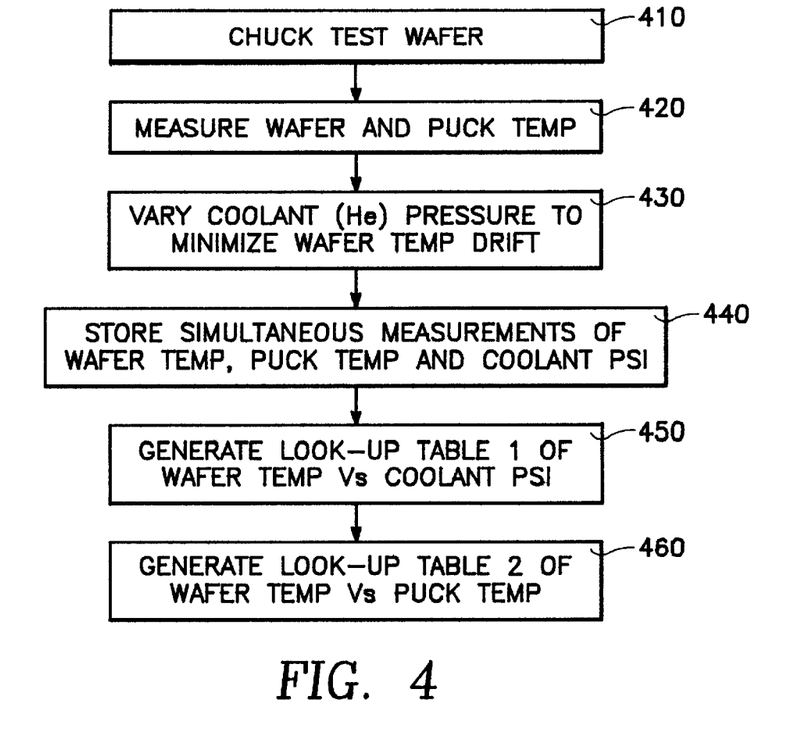
FIG. 4 illustrates a method of operating the system of FIG. 3 to characterize or measure the temperature behavior of a test wafer as a function of coolant pressure and as a function of wafer support or puck temperature.

Referring to FIG. 4, the test wafer 119 is chucked on the electrostatic chuck 111 (block 410 of FIG. 4), a plasma is struck and the wafer temperature and puck temperature are continuously monitored and recorded by the microprocessor 320 (block 420 of FIG. 4). The microprocessor 320 (or a human) varies the coolant pressure controlled by the pump 125 (block 430 of FIG. 4). This variation may be performed as part of a feedback control loop in an effort to maintain wafer temperature at a desired level, or else it may be a trial and error iterative process to find the best coolant pressure time profile. The resulting data from the three probes 305, 310, 315 is stored by the microprocessor 320 in the memory 330 (block 440). This data is then organized into a first look-up table (look-up table 1) correlating simultaneous readings from the wafer temperature probe 315 and the coolant pressure probe 310 (block 450 of FIG. 4). The data is also organized into a second look-up table (look-up table 2) correlating simultaneous readings from the wafer temperature probe 315 and the puck temperature probe 310 (block 460 of FIG. 4). Look-up tables 1 and 2 are then used to control helium (coolant) pressure based upon only measuring puck temperature during the plasma processing of production wafers.

Figure 5:
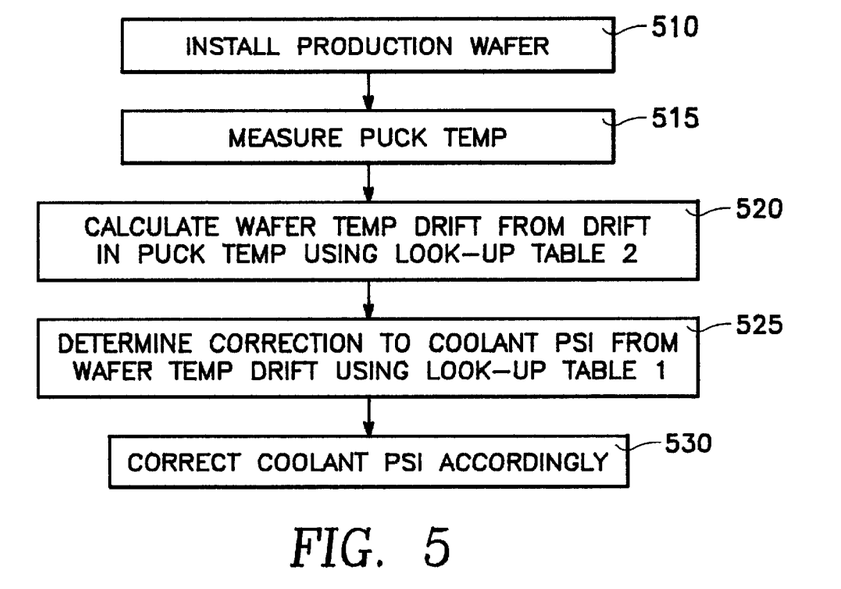
FIG. 5 illustrates a method of regulating the temperature of a production wafer by monitoring wafer support temperature or puck temperature using the wafer temperature behavior characterized in the method of FIG. 4.

Referring to FIG. 5, a production wafer (i.e., a semiconductor wafer lacking the mechanical cavity 160 formed in the test wafer 119 of FIG. 1) is chucked onto the electrostatic chuck 111 (block 510 of FIG. 5). The production wafer preferably has no cavity 160 and no dye on its backside, in order to satisfy specifications for production wafer purity and structural integrity. The optical temperature probe (i.e., the hollow lift pin 127, the light pipe 145 and the FOT 155, etc.) cannot be used with the production wafer because of the absence of any optical dye on the production wafer's backside. Therefore, one reactor, a test reactor including the optical probe, may be used to carry out the method of FIG. 4, while another reactor, a production reactor used to carry out the method of FIG. 5, may not necessarily include the optical temperature probe of FIG. 1. Alternatively, the same reactor that includes the optical probe may be used to carry out both operations. Continuing now with the description of the method of FIG. 5, a plasma is struck and the puck temperature is continuously monitored during plasma processing (block 515). Each sample of the puck temperature is used by the computer 320 to infer a corresponding wafer temperature using look-up table 2. From this, a wafer temperature drift (e.g., from desired temperature) is inferred (block 520). The temperature drift is used to infer from look-up table 1 an optimal correction to the coolant pressure (block 525). The coolant pressure is then corrected accordingly, and the process repeats itself with the next sample of puck temperature (block 530).

Figure 6:
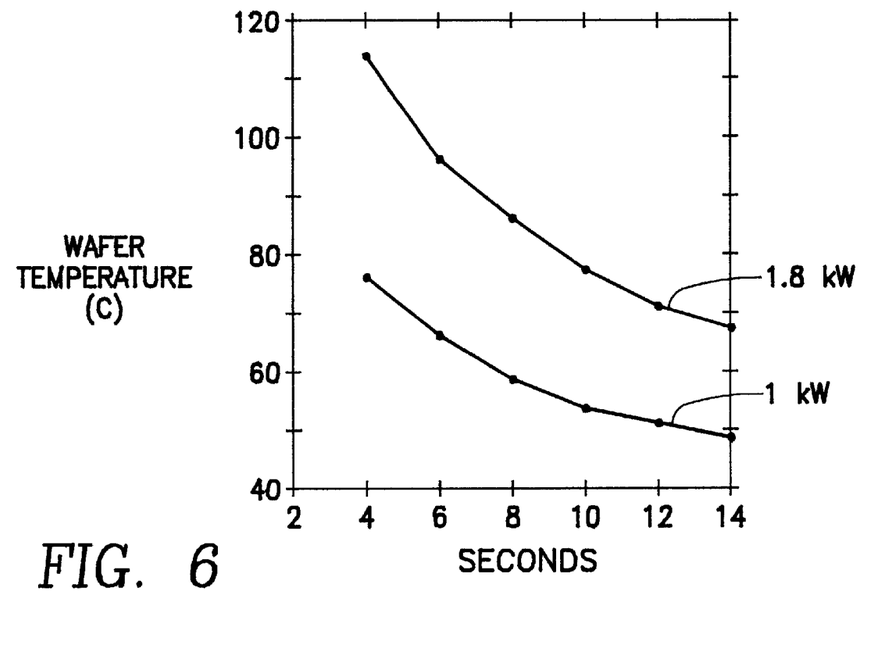
FIG. 6 is a graph illustrating the behavior of wafer temperature as a function of coolant pressure as measured with a test wafer using the optical probe of FIG. 1.
Figure 7:
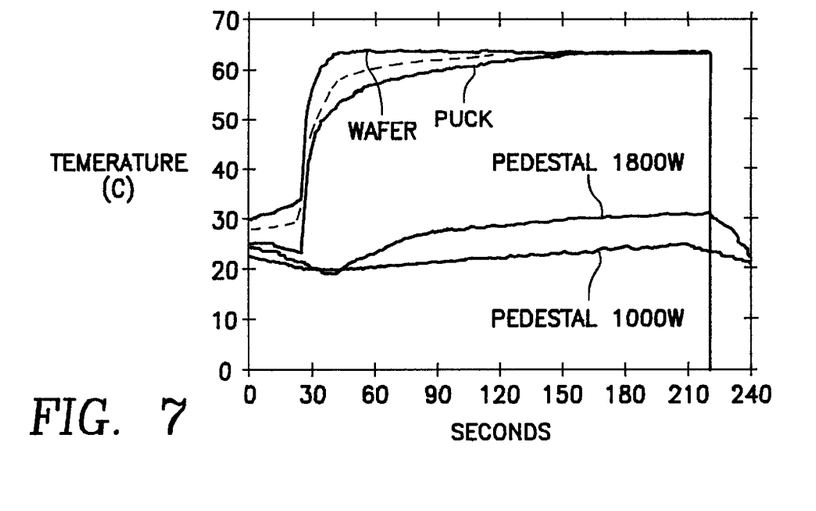
FIG. 7 is a graph illustrating the behavior of wafer temperature as a function of puck temperature as measured with a test wafer using the optical probe of FIG. 1.
Figure 8:
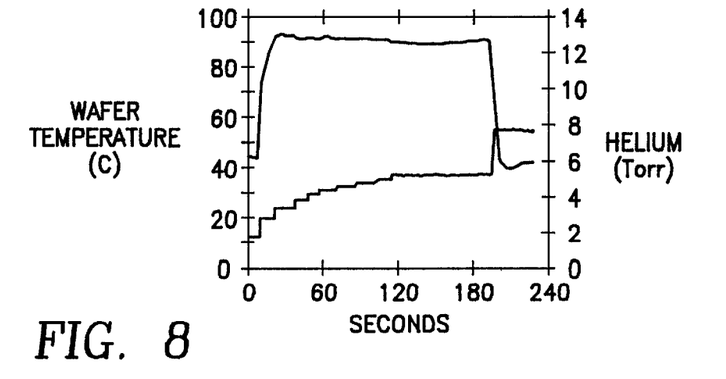
FIG. 8 is a graph illustrating how a fairly constant wafer temperature is achieved at plasma ignition by increasing the coolant pressure in a schedule of steps established by trial and error.

FIG. 6 is a graph depicting the data corresponding to look-up table 1 correlating simultaneous wafer temperature measurements and helium pressure measurements at two different RF power levels, 1.8 kWatts (upper curve) and 1.0 kWatts (lower curve). FIG. 7 is a graph depicting the data corresponding to look-up table 2 correlating simultaneous measurements of wafer temperature and puck temperature. In the graphs of both FIG. 6 and FIG. 7, plasma ignition begins at time 0 seconds. FIG. 7 shows that the difference between puck and wafer temperatures varies with the puck temperature. The behavior illustrated in FIG. 7 was obtained by varying the helium pressure in accordance with an optimal helium pressure time profile for maintaining a nearly constant wafer temperature (by permitting the wafer to reach its equilibrium temperature very quickly after plasma ignition). This profile was obtained by trial and error and is illustrated in FIG. 8. In FIG. 8, the step-wise curve is helium pressure as a function of time, and is the optimum profile referred to above. The upper curve in FIG. 8 is the wafer temperature as a function of time. Referring again to FIG. 7, the puck temperature apparently approaches the steady state wafer temperature in an asymptotic fashion and therefore the difference between wafer and puck temperature depends on the instantaneous puck temperature. The microprocessor 520, in controlling the temperature of a production wafer, correlates the current puck temperature with the closest puck temperature in look-up table 2 (whose contents corresponds to the graph of FIG. 7), and finds the corresponding wafer temperature. For example, a puck temperature of 50 degrees C in FIG. 7 corresponds to a wafer temperature of about 65 degrees C. If the desired wafer temperature were, for example, 60 degrees C, then an error of +5 degrees C has been detected. The correction to the coolant pressure is obtained by referring to the data of look-up table 1 represented by the graph of FIG. 6. Specifically, assuming the RF power is 1.8 KWatts, an excursion from 65 degrees to 60 degrees C corresponds to an increase in helium pressure of 1 Torr. Therefore, the helium pressure correction to be applied in this example is an increase of 1 Torr. This method is only a first order approximation but provides an improvement over conventional techniques which have generally assumed no need for wafer temperature correction.

Yet another approach is to use curve-fit the data of FIGS. 6 and 7 (look-up tables 1 and 2) to approximate constants of a quadratic equation expressing the wafer temperature T as a function of helium pressure P and puck temperature E:

$$T = AP^2 + BP + CE.$$

Once the constants A, B and C are found, the variation in helium pressure P to correct T is found in straight-forward fashion using conventional mathematical techniques carried out by the microprocessor 520.

Referring to FIG. 8, the problem of wafer temperature rise just prior to wafer de-chuck, when the helium pressure is removed, is solved by briefly reducing the RF power applied to the plasma to about 100 Watts.

Figure 9:
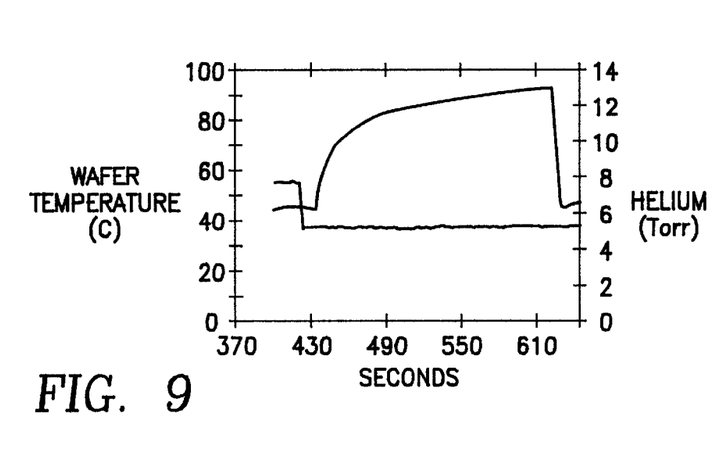
FIG. 9 is a graph corresponding to FIG. 8 in which the same reactor with the same process parameters was operated in the conventional manner with constant coolant pressure immediately upon plasma ignition, and illustrating for the sake of comparison the very slow rise of the wafer temperature.

FIG. 9 illustrates for the sake of comparison the inferior results obtained in the same reactor under the same conditions when the helium pressure is held constant throughout the process in accordance with conventional techniques. For nearly half of the duration of the process, the wafer temperature is below the steady state operating temperature.

While the invention has been described in detail by specific reference to preferred embodiments, it is understood that variations and modifications thereof may be made without departing from the true spirit and scope of the invention.

What is claimed is:

1. A method of maintaining the temperature of a production wafer during processing in a production plasma reactor near a desired temperature, said method comprising:

installing onto a test wafer support in a test reactor a test wafer having an optically reactive dye on a backside thereof;

optically observing through said test wafer support the optical behavior of said dye on said test wafer backside during plasma processing of said test wafer and deducing from said optical behavior the temperature of said test wafer as said test wafer is heated by interaction with plasma in said test reactor;

measuring the temperature of said test wafer support during plasma processing of said test wafer, and storing information in a memory correlating temperature of said test wafer with temperature of said test wafer support;

installing onto a production wafer support in said production reactor a production wafer;

measuring the temperature of said production wafer support during plasma processing of said production wafer;

inferring temperature drift of said production wafer from said production wafer support temperature using said information in said memory correlating said test wafer temperature and said test wafer support temperature; and changing the pressure of a coolant applied to said production wafer support so as to minimize said temperature drift of said production wafer.

2. The method of claim 1 wherein said test reactor and said production reactor are the same reactor and wherein said test wafer support and said production wafer support are the same wafer support.

3. The method of claim 1 further comprising:

during processing of said test wafer, measuring coolant pressure and storing in said memory information correlating coolant pressure and wafer temperature; and during processing of said production wafer inferring from said temperature drift an optimal change in said coolant pressure using said information correlating coolant pressure and wafer temperature, wherein the step of changing the coolant pressure is performed in accordance with said optimal change.

4. A method of maintaining the temperature of a production wafer during processing in a production plasma reactor near a desired temperature, said method comprising:

installing onto a test wafer support in a test reactor a test wafer having an optically reactive dye on a backside thereof;

optically observing through said test wafer support the optical behavior of said dye on said test wafer backside during plasma processing and deducing therefrom the temperature of said test wafer as said test wafer is heated by interaction with plasma in said test reactor;

establishing a time profile of coolant pressures of a coolant applied to said test wafer support which maintains said test wafer temperature as measured by said deducing step near a desired level during processing of said test wafer;

installing a production wafer onto a production wafer support in said production plasma reactor;

applying a coolant to said production wafer support with a coolant pressure, and regulating said coolant pressure in accordance with said time profile.

5. The method of claim 4 wherein said production reactor and said test reactor are the same reactor and wherein said production wafer support and said test wafer support are the same wafer support.

6. The method of claim 4 wherein said regulating of said coolant pressure in accordance with said time profile comprises starting said coolant pressure at a relatively low level upon plasma ignition and increasing said coolant pressure over time to allow for heating of said production wafer during plasma processing.

7. The method of claim 6 wherein said low level of said coolant pressure is sufficiently low to permit an optimally rapid rise in production wafer temperature following plasma ignition until a desired production wafer temperature is reached.

8. The method of claim 7 further comprising:

during processing of said test wafer, measuring the temperature of said test wafer support, and storing in a memory information correlating the wafer temperature with the wafer support temperature;

measuring the temperature of said production wafer support during plasma processing of said production wafer;

inferring temperature drift of said production wafer from said wafer support temperature using said information in said memory correlating said wafer temperature and said wafer support temperature; and     changing the coolant pressure so as to minimize said temperature drift of said production wafer.

9. In a plasma reactor for processing a semiconductor wafer on a wafer support within a plasma processing region, apparatus for maintaining the temperature of said wafer near a desired temperature, comprising:

a coolant supply for applying a coolant to the wafer support at a controllable coolant pressure;

a temperature sensor coupled to the wafer support;

a memory storing information correlating the wafer support temperature with the temperature of the wafer; and     a processor capable of inferring temperature drift of the wafer from the wafer support temperature using the information in the memory correlating wafer temperature and wafer support temperature, and of determining therefrom a change in said coolant pressure which tends to correct said temperature drift.

10. The apparatus of claim 9 further comprising:

information in said memory correlating wafer temperature and coolant pressure, wherein said processor determines from said temperature drift a change in coolant pressure by using said information correlating wafer temperature and coolant pressure.

11. The apparatus of claim 9 wherein the information in said memory correlating wafer temperature and wafer support temperature was obtained by the process of measuring the temperature of a test wafer by optical temperature sensing of the wafer backside through a wafer support during processing of the test wafer in a plasma reactor.

12. The apparatus of claim 10 wherein the information in said memory correlating wafer temperature and coolant pressure was obtained by the process of measuring the temperature of a test wafer by optical temperature sensing of the wafer backside through a wafer support during processing of the test wafer in a plasma reactor.

13. The apparatus of claim 10 wherein the information correlating wafer temperature and wafer support temperature and coolant pressure corresponds to a mathematical equation relating wafer temperature wafer support temperature and coolant pressure.

14. The apparatus of claim 10 wherein said wafer support temperature is measured at a ceramic puck of said wafer support directly contacting said wafer.

15. A method of maintaining the temperature of a production wafer during processing in a production plasma reactor near a desired temperature, said production wafer being supported on an electrostatic chuck of said production reactor which electrostatically clamps the wafer down, and wherein coolant pressure against said production wafer is countered by the clamping force of the chuck in a plasma processing region of the production reactor, said method comprising:

measuring the temperature of a test wafer and of a test wafer support during plasma processing of the test wafer mounted on said test wafer support in a test reactor, and storing information in a memory correlating temperature of said test wafer with temperature of said test wafer support;

installing a production wafer onto said electrostatic chuck of said production reactor;

measuring the temperature of a production wafer support of said chuck during plasma processing of said production wafer;

inferring temperature drift of said production wafer from said production wafer support temperature using said information in said memory correlating said test wafer temperature and said test wafer support temperature; and     changing the pressure of a coolant applied to said production wafer support so as to minimize said temperature drift of said production wafer.

16. The method of claim 15 further comprising:

prior to de-chucking said production wafer, reducing plasma RF source power of said reactor;

removing said coolant pressure, whereby the reduction in plasma RF source power prevents excessive heating of the wafer upon removal of the coolant pressure.

17. The method of claim 15 further comprising:

during processing of said test wafer, measuring coolant pressure and storing in said memory information correlating coolant pressure and wafer temperature; and     during processing of said production wafer inferring from said temperature drift an optimal change in said coolant pressure using said information correlating coolant pressure and wafer temperature, wherein the step of changing the coolant pressure is performed in accordance with said optimal change.

18. A method of maintaining the temperature of a production wafer during processing in a plasma reactor near a desired temperature, said wafer being supported on an electrostatic chuck which electrostatically clamps the wafer down, and wherein coolant pressure against said wafer is countered by the clamping force of the chuck in a plasma processing region of the reactor, said method comprising:

installing onto a wafer support in said reactor a test wafer having an optically reactive dye on a backside thereof;

optically observing through said wafer support the optical behavior of said dye on said wafer backside during plasma processing and deducing therefrom the temperature of a said wafer as said wafer is heated by interaction with plasma in said reactor;

establishing a time profile of coolant pressures of a coolant applied to said wafer support which maintains said wafer temperature as measured by said deducing step near a desired level during processing of said test wafer;

installing a production wafer onto a wafer support in a plasma reactor;

applying a coolant to said wafer support supporting said production wafer with a coolant pressure, and regulating said coolant pressure in accordance with said time profile.

19. The method of claim 18 further comprising:

prior to de-chucking said production wafer, reducing plasma RF source power of said reactor;

removing said coolant pressure, whereby the reduction in plasma RF source power prevents excessive heating of the wafer upon removal of the coolant pressure.

20. The method of claim 19 wherein said regulating of said coolant pressure in accordance with said time profile comprises starting said coolant pressure at a relatively low level upon plasma ignition and increasing said coolant pressure over time to allow for heating of said wafer during plasma processing.

* * * * *